United States Patent
Bloomquist et al.

(10) Patent No.: US 7,732,291 B2
(45) Date of Patent: Jun. 8, 2010

(54) SEMICONDUCTOR DEVICE HAVING STRESSED ETCH STOP LAYERS OF DIFFERENT INTRINSIC STRESS IN COMBINATION WITH PN JUNCTIONS OF DIFFERENT DESIGN IN DIFFERENT DEVICE REGIONS

(75) Inventors: Joe Bloomquist, Dresden (DE); Peter Javorka, Dresden (DE); Manfred Horstmann, Duerrroehrsdorf-Dittersbach (DE); Gert Burbach, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 559 days.

(21) Appl. No.: 11/608,591

(22) Filed: Dec. 8, 2006

(65) Prior Publication Data

US 2007/0254444 A1 Nov. 1, 2007

(30) Foreign Application Priority Data

Apr. 28, 2006 (DE) .................... 10 2006 019 936

(51) Int. Cl.
*H01L 29/80* (2006.01)
*H01L 21/336* (2006.01)
(52) U.S. Cl. .................... 438/305; 438/199; 438/238; 257/E21.335; 257/E21.663
(58) Field of Classification Search ............... 438/199, 438/305, 238
See application file for complete search history.

(56) References Cited

U.S. PATENT DOCUMENTS

| | | | |
|---|---|---|---|
| 6,436,747 B1 | 8/2002 | Segawa et al. | 438/197 |
| 7,060,549 B1 | 6/2006 | Craig et al. | 438/199 |
| 7,470,618 B2 | 12/2008 | Sayama et al. | 438/663 |
| 2004/0198002 A1 | 10/2004 | Murakami et al. | 438/279 |
| 2005/0118765 A1 | 6/2005 | Taniguchi et al. | 438/275 |
| 2005/0214998 A1 | 9/2005 | Chen et al. | 438/199 |
| 2005/0218455 A1 | 10/2005 | Maeda et al. | 257/368 |
| 2007/0010073 A1* | 1/2007 | Chen et al. | 438/486 |

FOREIGN PATENT DOCUMENTS

| | | |
|---|---|---|
| DE | 102005057074 A1 | 5/2007 |
| JP | 02-201922 | 8/1990 |
| WO | WO 2007/126807 A1 | 11/2007 |
| WO | WO 2008/016505 A1 | 2/2008 |

OTHER PUBLICATIONS

Letter and Official Communication Dated Mar. 6, 2007; German Application No. 10 2006 019 936.7-33.

* cited by examiner

*Primary Examiner*—Alexander G Ghyka
(74) *Attorney, Agent, or Firm*—Williams, Morgan & Amerson, P.C.

(57) ABSTRACT

By selectively performing a pre-amorphization implantation process in logic areas and memory areas, the negative effect of the interaction between stressed overlayers and dislocation defects may be avoided or at least significantly reduced in the memory areas, thereby increasing production yield and stability of the memory areas.

9 Claims, 3 Drawing Sheets

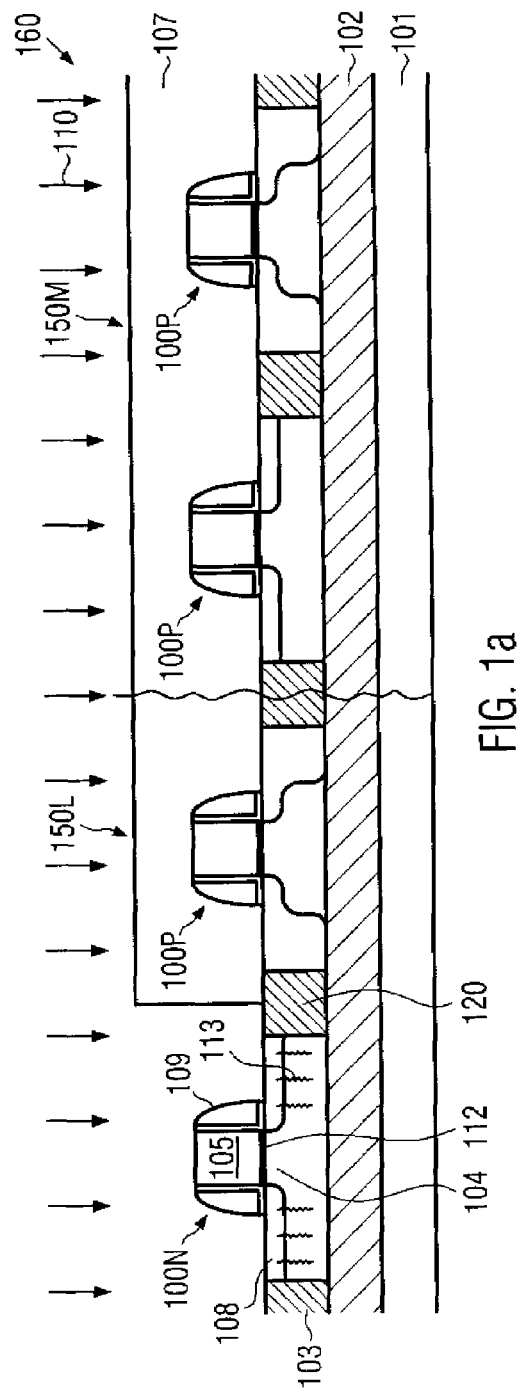
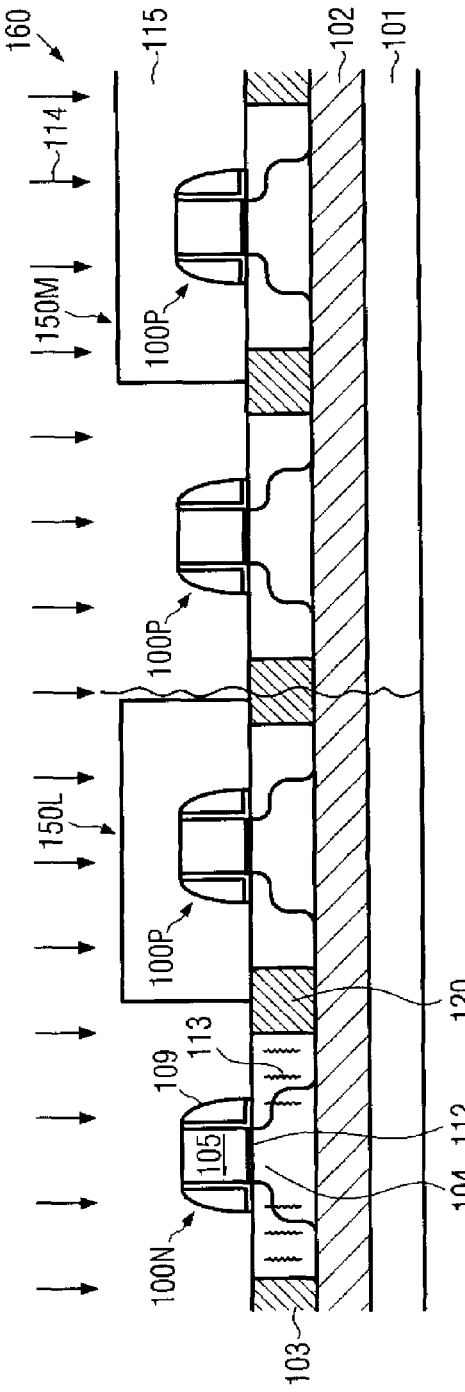
FIG. 1a
FIG. 1b

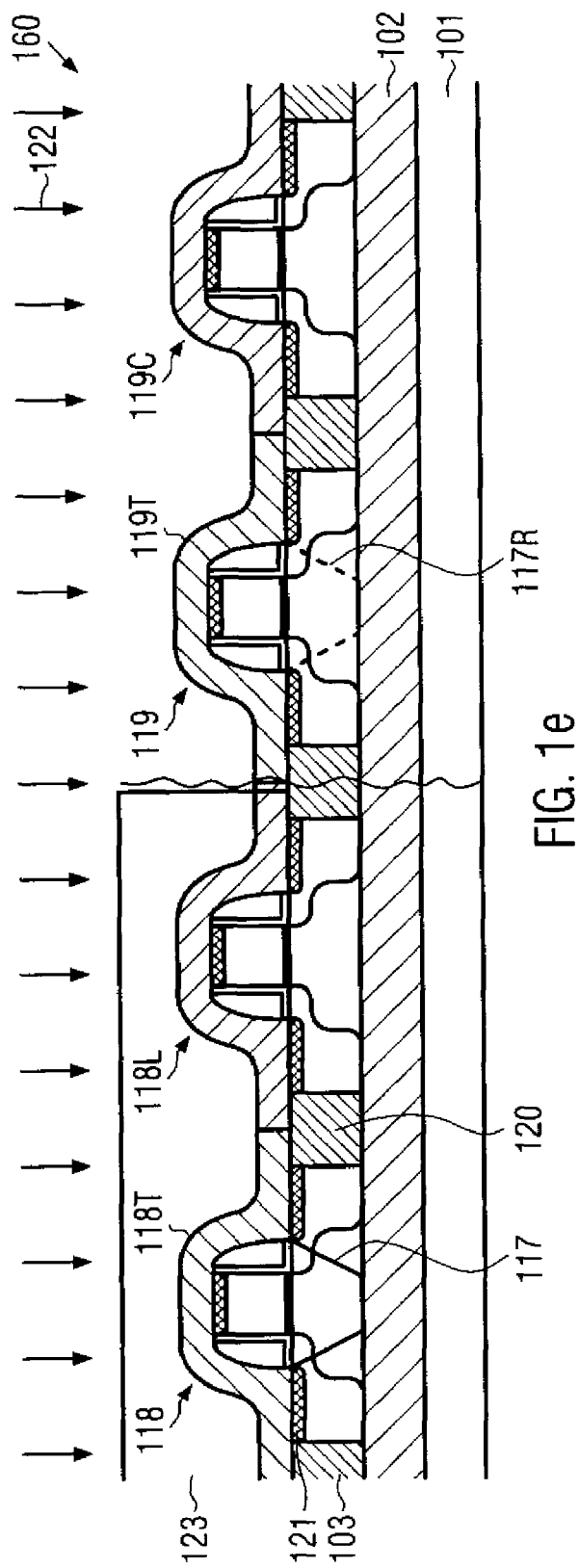
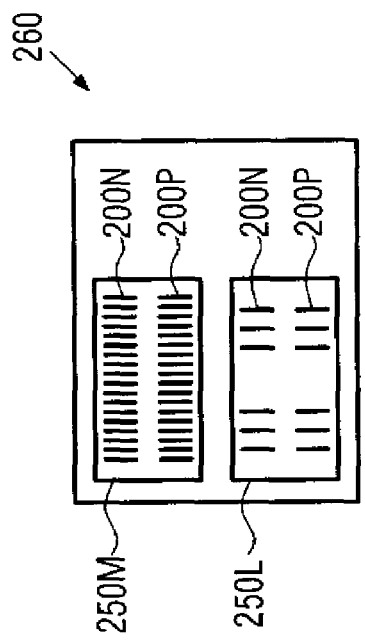
FIG. 1e
FIG. 2

SEMICONDUCTOR DEVICE HAVING STRESSED ETCH STOP LAYERS OF DIFFERENT INTRINSIC STRESS IN COMBINATION WITH PN JUNCTIONS OF DIFFERENT DESIGN IN DIFFERENT DEVICE REGIONS

BACKGROUND OF THE INVENTION

1. Field of the Invention

Generally, the present invention relates to the formation of integrated circuits, and, more particularly, to the formation of field effect transistors in complex circuits including a complex logic circuitry and a memory area, such as a cache memory of a CPU.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions also raises a plurality of issues associated therewith that have to be addressed so as to not unduly offset the advantages obtained by steadily decreasing the channel length of MOS transistors. One major problem in this respect is the reduction of so-called short channel effects, which occur upon reducing the channel length. Generally, with a reduced channel length, the controllability of the channel becomes increasingly difficult and requires specific design measures, such as reduction of the thickness of the gate insulation layer, increased doping concentrations in the channel regions and the like. These countermeasures may reduce the charge carrier mobility in the channel region. Accordingly, to further increase transistor performance, it has been proposed to increase the charge carrier mobility in the channel region for a given channel length.

In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device and may affect the channel controllability as previously explained, thereby making a reduction of the dopant concentration a less attractive approach unless other mechanisms are developed to adjust a desired threshold voltage. Second, the lattice structure in the channel region may be modified, for instance by creating tensile or compressive strain therein, which results in a modified mobility for electrons and holes, respectively. For example, creating tensile strain in the channel region may increase the mobility of electrons, which, in turn, may directly translate into a corresponding increase in the conductivity for N-type transistors. On the other hand, compressive strain in the channel region may increase the mobility of holes, thereby providing the potential for enhancing the performance of P-type transistors.

Therefore, a technique is frequently used that enables the creation of desired stress conditions within the channel region of different transistor elements by individually modifying the stress characteristics of a contact etch stop layer that is formed after completion of the basic transistor structure in order to form contact openings to the gate and drain and source terminals in an interlayer dielectric material. The effective control of mechanical stress in the channel region, i.e., effective stress engineering, may be accomplished by individually adjusting the internal stress in the contact etch stop layer in order to position a contact etch contact layer having an internal compressive stress above a P-channel transistor while positioning a contact etch stop layer having an internal tensile strain above an N-channel transistor, thereby creating compressive and tensile strain, respectively in the respective channel regions.

Moreover, other enhanced junction engineering techniques may be used in advanced SOI transistors for enhancing the performance thereof by creating more abrupt junctions for reducing the junction capacitance, which may translate into increased switching speed. To this end, a so-called pre-amorphization step may be performed prior to the drain/source implantation in order to more precisely define the dopant concentration. The substantially amorphous silicon in the drain and source regions requires, however, a re-crystallization anneal, which results in dislocation defects in the body region of the SOI transistor and in the drain and source regions. In SOI architectures, the further reduced junction capacitance in combination with the per se unwanted dislocation defects may result in a significant performance gain, since the increased junction leakage caused by the dislocation defects may reduce floating body effects while the reduced junction capacitance contributes to increased switching speed. Thus, this enhanced junction engineering may be combined with the stress layer approach in an attempt to further increase device performance. Although this technique is highly efficient in individually enhancing the performance of individual transistors, an increased failure probability and/or production yield may be observed in complex circuits comprising logic circuits and high density memory areas, such as static RAM (random access memory) cells, thereby rendering the above technique less desirable for the formation of highly advanced integrated circuits.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for forming transistor elements of enhanced performance by combining enhanced PN junction profiles, obtained on the basis of a pre-amorphization process, and stressed overlayers, such as stressed contact etch stop layers, wherein the combination of these two techniques is performed in a highly local manner in a complex semiconductor device. It has been recognized that, in specific functional blocks of a complex integrated circuit, the interaction of the stressed overlayers and the increased dislocation defects caused by the pre-amorphization implantation may result in increased yield loss and instabilities in memory cells, such as static RAM areas of complex CPUs and other circuits having formed therein extended memory areas. Consequently, a high performance gain may be obtained in device areas, in which the interaction of stressed overlayers and increased dislocation defect rates in the drain and source regions and the body regions of the respective transistors may have little or no adverse effect on yield, while, in highly sensitive areas, such as static RAM areas, the "intensity" of at least the degree of defect generation, possibly in combination with a reduction of stress transfer, may be adjusted in order to obtain high performance in combination with a desired yield and stability of the corresponding functional block. For this purpose, the pre-amorphization implantation may be performed in a locally selective manner so as to provide substantially no pre-amorphization in the sensitive device areas or perform a respective pre-amorphization implantation on the basis of significantly reduced dose and/or energy in order to obtain a reduced dislocation defect rate after the re-crystallization. Consequently, the combined effect of stressed overlayers and more abrupt dopant gradients at the PN junctions may be adjusted in a local fashion so as to obtain overall performance gain as well as an increase in yield and reliability.

According to one illustrative embodiment of the present invention, a method comprises performing a first pre-amorphization process of drain and source regions in first P-channel transistors and/or first N-channel transistors in a first device region, while second P-channel transistors and second N-channel transistors formed in a second device region of a semiconductor device are masked. Moreover, a stressed layer having a compressive stress is formed over the first and second P-channel transistors and a stressed layer having a tensile stress is formed over the first and second N-channel transistors.

According to another illustrative embodiment of the present invention, a semiconductor device is provided. The device comprises a first device region including a plurality of first P-channel transistors and first N-channel transistors, wherein the first P-channel transistors and the first N-channel transistors form a first functional block and wherein the first P-channel transistors and/or the first N-channel transistors have a first dislocation defect rate in the drain and source regions and the body regions thereof. The first defect rate is defined as the maximum defect rate in the first N-channel transistors and/or P-channel transistors. The device further comprises a second device region including a plurality of second P-channel transistors and second N-channel transistors, wherein the second P-channel transistors and the second N-channel transistors form a second functional block and wherein the second P-channel transistors and/or the second N-channel transistors have a second dislocation defect rate in the drain and source regions and the body regions thereof. The second defect rate is defined as the maximum defect rate of the second P-channel transistors and N-channel transistors, wherein the second defect rate is less than the first defect rate. Moreover, the device comprises a first dielectric stress layer formed in the first device region and comprising a plurality of first portions having a first intrinsic stress value and comprising a plurality of second portions having a second intrinsic stress value, wherein the first portions are formed above the first P-channel transistors and the second portions are formed above the first N-channel transistors. Finally, the device further comprises a second dielectric stress layer formed in the second device region and comprising a plurality of first portions having a third intrinsic stress value and the plurality of second portions having a fourth intrinsic stress value, wherein the first portions of the second dielectric stress layer are formed above the first P-channel transistors and the second portions are formed above the second P-channel transistors and the second portions are formed above the second N-channel transistors in the second device region.

BRIEF DESCRIPTION OF THE DRAWINGS

The invention may be understood by reference to the following description taken in conjunction with the accompanying drawings, in which like reference numerals identify like elements, and in which:

FIGS. 1a-1e schematically illustrate cross-sectional views of a semiconductor device having a first and a second device region, such as a logic area and a memory area, during the formation of transistor elements having stressed overlayers and different dislocation defects during various manufacturing stages according to the present invention; and FIG. 2 schematically illustrates a semiconductor device having a logic area and a memory area, wherein, in the memory area, respective transistor elements have a reduced defect rate and thus a less abrupt PN junction in the drain and source regions compared to a logic area having high performance transistors with an increased dislocation defect rate and stressed overlayers according to illustrative embodiments of the present invention.

Figure 1C:
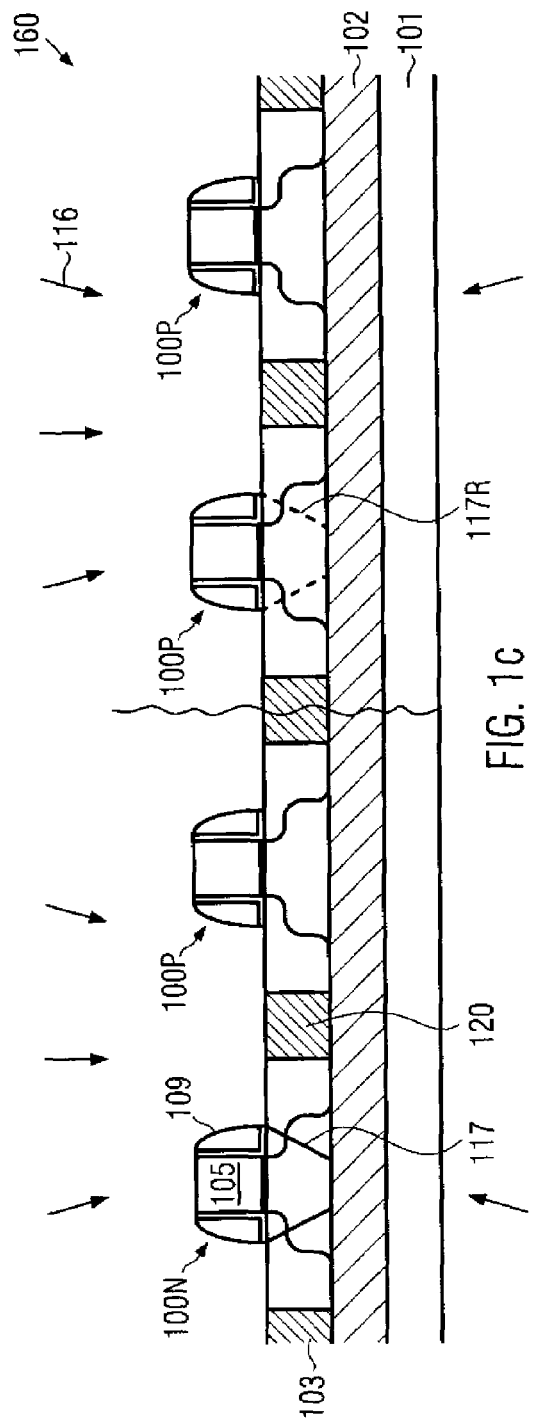

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for enhancing the performance of highly complex semiconductor devices, such as devices including highly scaled field effect transistors, wherein, in illustrative embodiments, the respective transistors are provided in a silicon-on-insulator (SOI) configuration, wherein stressed overlayers are used to create a respective strain in P-channel transistors and N-channel transistors, while locally an enhanced junction engineering is employed for selectively further enhancing the transistor performance in less sensitive device areas. In the present invention, it is contemplated that a significant interaction exists between a stress-inducing mechanism based on stressed overlayers, such as stressed contact etch stop layers, and the pre-amorphization in combination with the associated re-crystallization process, in which enhanced junction profiles are created, thereby also, however, generating significant dislocation defects. It has been recognized that, in particular in sensitive device areas, such as static RAM areas, which may act as cache memories of CPUs and the like, an increased yield loss and instability of the respective memory cells may be reduced by appropriately reducing the intensity of the pre-amorphization mechanism or by avoiding a corresponding pre-amorphization in the respective device areas. Without intending to restrict the present invention to the following explanation, it may be assumed that the increased sensitivity is correlated with threshold variations, which may significantly depend on the drive current capability of the respective transistors in combination with the defect rate, in particular when SOI architectures are considered, wherein the corresponding transistor body may not be connected to a reference potential. Consequently, any variations of the effectiveness and intensity of dislocation defects, which may in principle provide a high junction leakage and thus reduce floating body effects, may therefore significantly affect the operational behavior of circuitry, in which a high degree of threshold voltage matching is required. Consequently, in functional blocks in which threshold voltage related dependencies are less critical, such as logic blocks, in which, however, high transistor performance is desirable, the approaches of reduced junction capacitance and stressed overlayers may be effectively combined. In other device areas, such as static RAM areas, the intensity of the respective pre-amorphization and thus junction profile adjustment is significantly reduced, wherein, in some illustrative embodiments, the degree of stress induced in the corresponding device regions may also be reduced compared to the logic block. Hence, compared to conventional techniques without a selective combination of these approaches, a significantly increased yield may be obtained, substantially without any performance degradation. On the other hand, compared to conventional techniques, in which only one of the approaches is used in order to provide enhanced yield, a significant gain in performance for otherwise identical circuit arrangements may be achieved.

With reference to FIGS. 1a-1e and 2, further illustrative embodiments of the present invention will now be described in more detail. FIG. 1a schematically illustrates a semiconductor device 160 comprising a first device region 150L, which may represent a region including logic circuitry which may be less sensitive with respect to the interaction of stress gradients and dislocation defects, and a second device region 150M, which may represent a device region of high integration density, such as a static RAM area, for instance acting as a cache memory region for a logic circuitry, such as the region 150L. The second device region 150M may comprise transistor devices that are sensitive to the combined effect of induced stress, such as high stress gradients, tensile or compressive stress in combination with respective dislocation defects, so that operational instabilities and yield loss may result, as is previously explained.

Each of the first and second device regions 150L, 150M may comprise a plurality of N-channel and P-channel transistors 100N, 100P, wherein, for convenience, only one representative of each transistor type in each of the first and second device regions 150L, 150M is illustrated. It should be appreciated that the transistor elements 100N, 100P in the first device region 150L may be different in configuration from the corresponding N-channel and P-channel transistors 100N, 100P of the second device region 150M, wherein, however, for convenience, any such structural differences are not illustrated in the drawings. In other illustrative embodiments, the transistors in the first and second device regions 150L, 150M may have substantially the same configuration, for instance with respect to critical dimensions and the like, except for a different transistor width, such that a high degree of compatibility in the respective manufacturing processes in both device regions is provided and therefore respective manufacturing processes may be commonly performed in the first and second device regions 150L, 150M. For instance, the transistors 100N in the first and second device regions 150L, 150M may represent SOI transistors receiving substantially the same drain and source regions, except for differences with respect to junction capacitance requiring a difference in the pre-amorphization implantation, as will be described later on. The same holds true for the P-channel transistors 100P in both device regions 150L, 150M. It should further be noted that, although the present invention is particularly advantageous for transistor elements without other stress-inducing components, such as additional epitaxially grown layers formed in or below the respective channel regions, the present invention may also be combined with such additional strain-inducing techniques.

The semiconductor device 160 comprises a substrate 101 having formed thereon an insulating layer 102, such as a buried silicon dioxide layer, a silicon nitride layer and the like, followed by a crystalline semiconductor layer 103, which, in some illustrative embodiments, is a silicon-based layer, since the vast majority of integrated circuits including complex logic circuits is and will be in the foreseeable future based on silicon. It should be appreciated, however, that the semiconductor layer 103 may comprise any other appropriate components as required by design rules. For instance, silicon/germanium mixtures or silicon/carbon mixtures and the like may also be considered as silicon-based materials. Some or all of the respective N-channel and P-channel transistors 100N, 100P may be separated from each other by corresponding isolation structures 120, for instance in the form of a trench isolation. The N-channel and P-channel transistors 100N, 100P further comprise a gate electrode structure 105, for instance comprised of polysilicon, which is separated from a corresponding channel region 104 by a gate insulation layer 112. The channel region 104 may represent a specific portion of a so-called body region, which, in turn, laterally separates appropriately doped source and drain regions 111 that may include respective extension regions 108. It should be appreciated that, in the manufacturing stage as shown in FIG. 1a, depending on the process strategy and the device requirements, the respective drain and source regions 111 may already be formed in the P-channel transistors 100P, when any pre-amorphization techniques may not be required in the P-channel transistors 100P. Moreover, the N-channel transistors 100N of the first and second regions 150L, 150M may have formed therein at this stage the extension regions 108, while the respective drain and source regions are still to be formed. Moreover, respective sidewall spacers 109 may be formed on sidewalls of the gate electrode 105 in order to provide the lateral profiling of the drain and source regions 111 and, in the illustrative embodiment shown in FIG. 1a, for the corresponding lateral offset of a pre-amorphization implantation 110.

The implantation process 110 is designed so as to obtain a desired degree of amorphization in the N-channel transistor 100N in the first device region 150L in order to obtain enhanced implantation conditions in a subsequent implantation for forming the deep drain and source regions in the transistors 100N of the first region 150L. For example, a heavy inert species, such as xenon and the like, or germanium and the like, may be used with an appropriately selected dose and energy in order to create heavy lattice damage so as to substantially amorphize the corresponding area of the semiconductor layer 103. During the implantation process 110, an appropriately designed implantation mask 107, such as a resist mask, may be provided to at least cover the second device region 150M in order to avoid the amorphization in the respective transistors of the second region 150M. It should be appreciated that, in other illustrative embodiments, when a corresponding pre-amorphization on the basis of the process 110 is also desired in the P-channel transistor 100P in the first region 150L, the resist mask 107 may be formed at an earlier manufacturing stage, i.e., prior to the formation of the deep drain and source regions 111 in the P-channel transistors 100P, so as to also expose the transistor 100P in the first region 150L.

The semiconductor device 160 as shown in FIG. 1a may be formed on the basis of well-established process techniques, except for the implantation process 110 based on the appropriately designed implantation mask 107. That is, after the provision of the substrate 101, which may have formed thereon the buried insulating layer 102 and the semiconductor layer 103, the isolation structures 120 may be formed on the basis of well-established lithography, etch, deposition and planarization techniques when trench isolations are considered. Thereafter, the respective dopant concentration in the semiconductor areas defined by the isolation structures 120 may be formed on the basis of well-established implantation techniques, followed by oxidizing and/or depositing an appropriate material for the gate insulation layers 112 followed by the deposition of gate electrode material. Based on respective advanced photolithography and etch techniques, these layers are patterned and the extension regions 108 may be formed on the basis of appropriate offset spacers (not shown), wherein other additional implantations, such as halo implantations and the like, may also be performed. Next, the sidewall spacer 109 may be formed on the basis of well-established techniques, involving the formation of a liner, if required, followed by the deposition of a spacer material, such as silicon nitride, silicon oxide and the like, in combination with an appropriately designed anisotropic etch process. In the illustrative embodiment shown in FIG. 1a, the drain and source regions 111 may be formed on the basis of appropriately designed implantation processes in the P-channel transistors 100P, while covering the respective N-channel transistors 100N in the first and second device regions 150L, 150M according to well-established CMOS manufacturing techniques.

When an advanced junction engineering is also required in the P-channel transistor 100P of the first region 150L, the pre-amorphization implantation 110 may be performed prior to the formation of the drain and source regions 111 on the basis of the resist mask 107, which may then also expose the transistor 100P of the first region 150L. As previously explained, the implantation process 110 may be designed so as to create the required heavy lattice damage, indicated as 113, which may result in an improved implantation behavior in a subsequent source/drain implantation for the N-channel transistors 100N. As is well known, sophisticated simulation programs as well as a high amount of engineering experience is available with respect to the implantation of a plurality of ionic species into silicon material, so that appropriate implantation parameters may be readily selected on the basis of simulation and/or experience. In other cases, respective implantation parameters may be readily established on the basis of experiments.

FIG. 1b schematically illustrates the semiconductor device 160 during a further implantation process 114 on the basis of a correspondingly designed implantation mask 115 which, in the embodiment illustrated, exposes the N-channel transistors 100N in both regions 150L, 150M. As previously explained, in some illustrative embodiments, the transistors 100N in the regions 150L, 150M may have substantially the same configuration, except for transistor width, so that substantially the same basic process steps may be commonly performed for these transistor devices. The same may hold true for the P-channel transistors 100P. In other illustrative embodiments, however, the configuration of the N-channel transistors 100N may be different in the first region 150L and in the second region 150M, thereby requiring, for instance, different implantation parameters, which may be accomplished by performing the respective implantation process 114 in several steps, in which the respective N-channel transistors are masked, while the other type of N-channel transistor is exposed. During the implantation 114, the respective dopants may be introduced into the substantially amorphized portion 113 in a more localized fashion, for instance compared to the transistor 100N of the second region 150M due to a modified penetration behavior, in particular with respect to any channeling effects and the like.

FIG. 1c schematically illustrates the semiconductor device 160 after the completion of the implantation process 114 and the removal of the implantation mask 115. Moreover, the device 160 is subjected to an anneal process 116 in order to crystallize the substantially amorphized portion 113 and also to activate the dopants introduced in the implantation 114 and during any source/drain implantations for forming the drain and source regions 111 in the P-channel transistors 100P. Consequently, during the re-crystallization, respective dislocation defects 117 are generated within the drain and source regions 111 and in the channel region 104, wherein the defect rate may depend on the "intensity" or degree of amorphization generated during the implantation 110, as is previously explained. Contrary to the device 100N in the first region 150L, the device 100N in the second region 150M may substantially lack any corresponding dislocation defects 117, or may have at least a significantly reduced number or length.

When a certain degree of enhanced junction engineering is also desired in the region 150M, in other illustrative embodiments, the implantation 110 may be performed on the basis of the mask 107 as shown in FIG. 1a, as is described above, and thereafter a further pre-amorphization implantation process may be performed on the basis of an appropriately designed implantation mask, which may cover all of the transistor elements except for the transistor 100N in the second region 150M, when this transistor is selected to receive a pre-amorphization implantation, however at a significantly reduced intensity. For this purpose, the respective implantation parameters used during the process 110 may be correspondingly altered, for instance by using a reduced dose and energy for the same implantation species. In other cases, a different implantation species may be selected on the basis of appropriate implantation parameters to provide a reduced degree of amorphization. Thereafter, the further processing may be continued as described with reference to FIG. 1b and FIG. 1c, wherein, during the drain/source implantation 114, a moderately improved dopant profile may also be generated in the N-channel transistor 100N in the second region 150M, however less pronounced compared to the N-channel transistor 100N of the first region 150L. Similarly, during the anneal process 116, the less amorphized semiconductor region of the transistor 100N in the second region 150M may produce a less pronounced defect rate 117R, wherein it should be understood that the term "defect rate" may refer to a reduced number of dislocation defects, a reduced dislocation defect length and the like, and thus the term "degree of defect rate" is to be understood as indicating a specific criterion for the evaluation of the intensity of respective dislocation defects. It should also be appreciated that a corresponding pre-amorphization with reduced intensity may also be applied to the P-channel transistor 100P in the second region 150M, if a corresponding more pronounced dopant profile for the respective PN junctions in these devices is required.

Figure 1D:
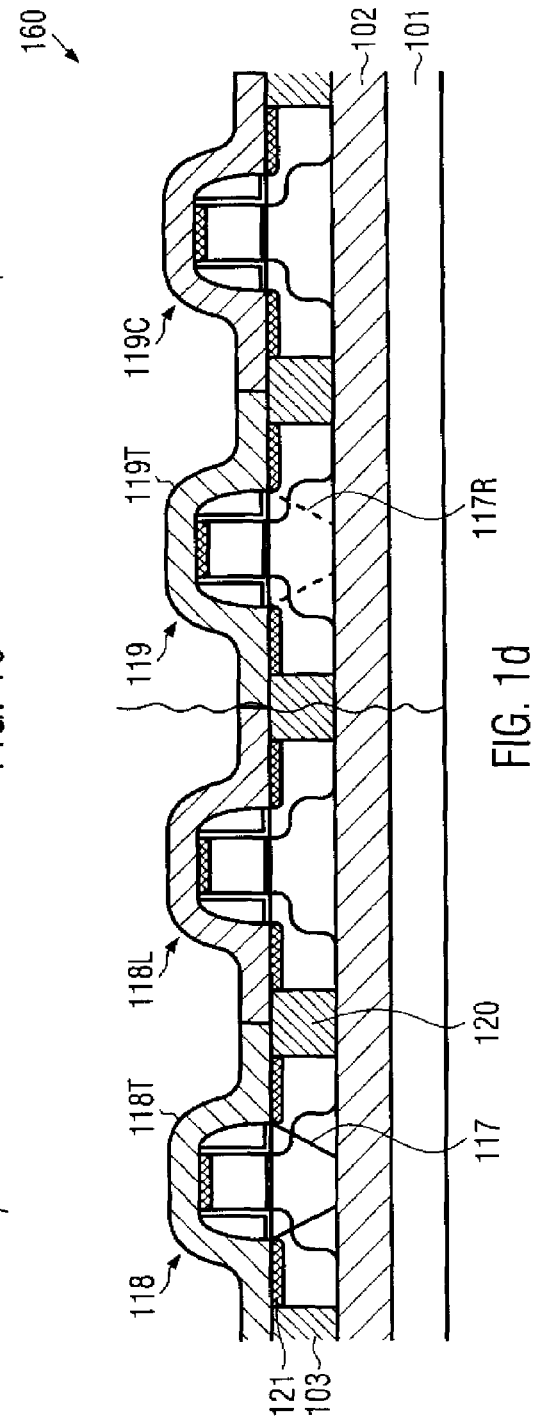

FIG. 1d schematically illustrates the semiconductor device 160 in a further advanced manufacturing stage. A first stressed overlayer 118, for instance comprised of silicon nitride, possibly in combination with a thin liner material, may be formed above the transistors in the first region 150L, and a second stressed overlayer 119, which may also be comprised of silicon nitride, possibly in combination with a respective liner material, is formed above the transistor elements in the second region 150M. Each of the first and second stressed layers 118, 119 may comprise a first portion and a second portion having different intrinsic stress values or even different intrinsic types of stress. For instance, the first layer 118 may comprise a first portion 118T having a tensile intrinsic stress so as to impart a respective tensile stress to the channel region 104 of the transistor 100N, when representing an N-channel transistor. On the other hand, the layer 118 may have a second portion 118C having a compressive stress in order to provide a compressive strain in the respective body region 104 of the transistor 100P, when representing a P-channel transistor. Similarly, the stressed overlayer 119 may comprise a first portion 119T formed above the N-channel transistor in the second region 150M, thereby providing tensile strain in the channel region thereof, while a second portion 119C may provide a respective compressive strain in the channel region of the transistor 100P. In some illustrative embodiments, the intrinsic stress values of the portions 118T and 119T may be substantially equal each other, since these layer portions may be formed on the basis of the same initially deposited stressed layer material. Similarly, the compressive intrinsic stress values of the portions 118C and 119C may be substantially equal, since these layer portions may also be formed from a common initial layer material. In other illustrative embodiments, the stress values of the portions 118T and 119T may differ from each other such that the portion 119T may have a reduced tensile stress compared to the portion 118T. Similarly, the portion 118C may have a reduced compressive stress compared to the portion 119C. A corresponding process technique for providing different stress values in the first and second device regions 150L, 150M will be described with reference to FIG. 1e later on.

Moreover, in this manufacturing stage, the transistors 110N, 110P may further comprise respective metal silicide regions 121, wherein, in some illustrative embodiments, at least some of the layer portions 118T, 118C, 119T, 119C may be directly formed on the corresponding metal silicide regions 121. It should be appreciated that, in the second device region 150M, the interaction of the intrinsic stress provided by the stressed overlayer 119 with corresponding dislocation defects is significantly reduced compared to the first device region 150L, due to the missing or less intensive pre-amorphization in the second region 150M. Moreover, as previously explained with reference to the reduced defect rate 117R, the transistor performance in the second region 150M may be appropriately adjusted in order to obtain the required performance gain, while still maintaining yield loss and stability problems within a specified tolerance. That is, for substantially identical intrinsic stress values for the layers 118 and 119, the reduced defect rate in the transistors 110N and possibly in the transistors 100P of the second region 150M may provide a moderately high transistor performance at significantly increased yield and stability, for instance for static RAM cells, while, in the first region 150L, significantly enhanced transistor performance is obtained due to the increased abruptness of the respective PN junctions of the N-channel transistors 100N and, if desired, in the P-channel transistors 100P. In other cases, in addition to reducing the intensity of a pre-amorphization implantation or omitting the same in the second device region 150M, a reduction of intrinsic stress in the layer portions 119T and 119C may be performed so as to appropriately reduce the interaction of dislocation defects, when provided in a moderate form with respect to yield and operational stability.

The semiconductor device 160 as shown in FIG. 1d may be formed on the basis of the following processes. The metal silicide regions 121 may be formed on the basis of any appropriate silicidation regime which may, for instance, include the deposition of any appropriate refractory metal, such as nickel, platinum, cobalt, combinations thereof and the like, after which an appropriate heat treatment may be performed to initiate a corresponding chemical reaction with the underlying silicon material. After the removal of any excess material and any optional heat treatments for thermally stabilizing the metal silicide regions 121, an appropriate deposition and etch scheme may be applied to provide the layers 118 and 119. For example, a compressively stressed layer material may be deposited, for instance on the basis of well-established plasma enhanced chemical vapor deposition (PECVD) techniques, in which process parameters may be adjusted to obtain a high degree of intrinsic compressive stress. Thereafter, the corresponding material may be patterned on the basis of an appropriately designed resist mask in order to remove the corresponding compressively stressed material from the N-channel transistors 100N in the first and second regions 150L, 150M, thereby forming the portions 118C and 119C. Thereafter, a dielectric layer having a high tensile stress may be deposited and thereafter an appropriately designed resist mask may be provided so as to remove the tensile stress layer from the P-channel transistors, thereby providing the layer portions 118T and 119T. For this purpose, an additional liner (not shown) may be provided to reliably control the removal of the tensile stress layer from the P-channel transistors, substantially without compromising the previously formed portions 118C and 119C. In other cases, an inverse process sequence may be performed with respect to the compressive or tensile stress layer, wherein, additionally, other liner materials may be introduced to act as appropriate etch stop layers, if required.

FIG. 1e schematically illustrates the semiconductor device 160 during an optional relaxation implantation 122, for instance on the basis of a heavy inert species, such as xenon, wherein an implantation mask 123, such as a resist mask, may cover the first device region 150L. As previously explained, in some illustrative embodiments, a reduced intrinsic stress in one or both of the layer portions 119T and 119C may be required to obtain, in combination with the spatially selective pre-amorphization implantation, the required performance of the transistors in the second device region 150M. In this case, a certain degree of stress relaxation may be obtained during the ion bombardment associated with the implantation process 122, wherein implantation parameters, such as dose and energy, implantation time, and the like, may be appropriately selected so as to obtain the desired degree of relaxation. In other illustrative embodiments, the implantation mask 123 may be designed such that one of the portions 119T, 119C is exposed only, thereby providing selective relaxation in the second device region 150M.

Thus, the degree of performance gain in the first and second device regions 150L, 150M may be adjusted on the basis of two mechanisms, wherein, in the first device region, a high stress and a high degree of pre-amorphization and thus reduction of junction capacitance may be used, while, in the second sensitive device region 150M, a significantly reduced pre-amorphization is provided, wherein, in some illustrative embodiments, in combination, a respective adaptation of the intrinsic stress in one or more different transistor types may be provided. Consequently, enhanced performance of the device 160 may be obtained, while yield and stability may be improved. The manufacturing scheme regarding the pre-amorphization as described above may be performed for the transistors 100N, 100P in the first region 150L individually or commonly. That is, in some embodiments, the transistors 100N, 100P may commonly receive the pre-amorphization implantation, while, in other embodiments, the pre-amorphization may be performed separately for each transistor type. The same holds true for the transistors of the second region 150M, when receiving a pre-amorphization of reduced intensity.

FIG. 2 schematically illustrates a semiconductor device 260, which comprises a static RAM area 250M and a logic functional block 250L, wherein the static RAM area comprises a plurality of N-channel transistors 200N and a plurality of P-channel transistors 200P, which may be formed according to a process sequence as previously described with reference to FIGS. 1a-1e. That is, the N-channel transistors 200N and/or the P-channel transistors 200P may have received a pre-amorphization implantation with reduced intensity or may have received no pre-amorphization implantation at all, while respective stressed overlayers may be formed above the transistors 200N and 200P with appropriate stress values to enhance transistor operation and provide reduced yield loss and increased stability. Similarly, the functional logic block 250L may comprise N-channel transistors 200N and P-channel transistors 200P, wherein the transistors 200N and/or the transistors 200P may have experienced a pre-amorphization implantation of enhanced intensity so as to provide more abrupt PN junctions in one or both types of transistors, indicated by an increased dislocation defect rate, i.e., increased defect length or defect count, while additionally overlayers of high intrinsic stress values are provided above the respective transistor elements. Consequently, in the functional logic block 250L, high performance of the transistors is achieved, since here an interaction between the stressed overlayers and the moderately high defect rate may not significantly degrade operational stability of the block 250L.

As a result, the present invention provides a technique for effectively combining two different mechanisms for enhancing transistor performance, wherein at least the creation of substantially amorphized portions prior to the formation of respective drain and source regions is performed in a localized manner in order to differently control the interaction between stress-inducing sources and dislocation defects in different device regions, which may result from re-crystallization of the substantially amorphized semiconductor regions. Thus, based on the finding that stressed overlayers may interact with increased dislocation defect rates such that the operational stability of static RAM areas may be compromised, the corresponding pre-amorphization implantation is performed with different parameters in logic areas and memory areas in order to significantly reduce the defect rate in the memory areas. Consequently, high transistor performance may be obtained in the logic areas, while operational stability and thus yield in the memory area may be increased, while a moderately high performance gain may still be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

performing a first pre-amorphization process of drain and source regions in at least one of first P-channel transistors and first N-channel transistors in a first device region, while masking second P-channel transistors and second N-channel transistors formed in a second device region of a semiconductor device, wherein said first device region comprises a logic region and said second device region comprises a memory region;

performing a source/drain dopant implantation after performing said first pre-amorphization process;

forming a stressed layer having a compressive stress over said first and second P-channel transistors; and forming a stressed layer having a tensile stress over said first and second N-channel transistors.

2. The method of claim 1, wherein said second device region represents a memory area comprising static RAM cells.

3. The method of claim 1, further comprising performing a second pre-amorphization process in at least one of said second P-channel and second N-channel transistors with at least one of a reduced implantation energy and a reduced implantation dose relative to said first pre-amorphization process.

4. The method of claim 1, wherein said first pre-amorphization process is commonly performed in said first P-channel transistors and first N-channel transistors.

5. The method of claim 1, wherein said first pre-amorphization process is performed separately in said first P-channel transistors and said first N-channel transistors.

6. The method of claim 3, wherein said second pre-amorphization process is commonly performed in said second P-channel transistors and said second N-channel transistors.

7. The method of claim 3, wherein said second pre-amorphization process is performed separately in said second P-channel transistors and said second N-channel transistors.

8. The method of claim 1, wherein said second substrate region comprises a memory circuit including said second P-channel transistors and said first N-channel transistors.

9. The method of claim 1, further comprising reducing an intrinsic stress of said stressed layer formed above said second P-channel transistors and said second N-channel transistors.

* * * * *